United States Patent
Lu et al.

(10) Patent No.: US 7,365,427 B2
(45) Date of Patent: Apr. 29, 2008

(54) STACKABLE SEMICONDUCTOR PACKAGE

(75) Inventors: Yung-Li Lu, Kao-Hsiung Hsien (TW); Gwo-Liang Weng, Kao-Hsiung (TW)

(73) Assignee: Advanced Semiconductor Engineering, Inc., Nantze Export Processing Zone, Kao-Hsiung (TW)

( * ) Notice: Subject to any disclaimer, the term of this patent is extended or adjusted under 35 U.S.C. 154(b) by 0 days.

(21) Appl. No.: 11/616,277

(22) Filed: Dec. 26, 2006

(65) Prior Publication Data
US 2007/0246815 A1 Oct. 25, 2007

(30) Foreign Application Priority Data
Apr. 21, 2006 (TW) ................................ 95114220 A

(51) Int. Cl.
*H01L 23/48* (2006.01)
(52) U.S. Cl. ...................................... 257/723; 257/686
(58) Field of Classification Search ................ 257/723, 257/678, 777
See application file for complete search history.

(56) References Cited

U.S. PATENT DOCUMENTS

| | | | | |
|---|---|---|---|---|
| 5,422,435 A | * | 6/1995 | Takiar et al. ............... 174/521 |
| 6,627,983 B2 | * | 9/2003 | Tu et al. ...................... 257/680 |
| 6,847,105 B2 | | 1/2005 | Koopmans | |
| 7,161,249 B2 | * | 1/2007 | Shim et al. .................. 257/777 |
| 2002/0079567 A1 | * | 6/2002 | Lo et al. ...................... 257/685 |

* cited by examiner

Primary Examiner—Roy Potter
(74) Attorney, Agent, or Firm—Winston Hsu

(57) ABSTRACT

The present invention relates to a stackable semiconductor package, comprising a first substrate, a chip, a second substrate, a plurality of second wires, a plurality of supporting elements and a molding compound. The chip is disposed on and electrically connected to the first substrate. The second substrate is disposed above the chip, and the area of the second substrate is larger than that of the chip. The second substrate is electrically connected to the first substrate by the second wires. The supporting elements are disposed between the first substrate and the second substrate, and are used for supporting the second substrate. The molding compound encapsulates the first surface of the first substrate, the chip, the second wires, the supporting elements and part of the second substrate, and exposes a surface of the second substrate. The overhang portion of the second substrate will not shake or sway during wire bonding process.

8 Claims, 5 Drawing Sheets

STACKABLE SEMICONDUCTOR PACKAGE

BACKGROUND OF THE INVENTION

1. Field of the Invention

The present invention relates to a stackable semiconductor package, and more particularly, to a stackable semiconductor package including at least one supporting element for supporting.

2. Description of the Prior Art

Please refer to FIG. 1. FIG. 1 is a cross-sectional schematic diagram showing a prior art stackable semiconductor package. The prior art stackable semiconductor package 1 includes a first substrate 11, a chip 12, a second substrate 13, a plurality of wires 14 and a molding compound 15. The first substrate 11 has a first surface 111 and a second surface 112. The chip 12 connects to the first surface 111 of the first substrate 11 by means of flip chip technology. The second substrate 13 is adhered to the chip 12 by an adhesive layer 16. The second substrate 13 has a first surface 131 and a second surface 132, where the first surface 131 has a plurality of first bonding pads 133 and a plurality of second bonding pads 134 thereon. In top view, the area of the second surface 132 is larger than the area of a surface of the chip 12. This makes some portions of the second substrate 13 extend beyond the chip 12, and become an overhang portion.

The wires 14 electrically connect the first bonding pads 133 of the second substrate 13 to the first surface 111 of the first substrate 11. The molding compound 15 encapsulates the first surface 111 of the first substrate 11, the chip 12, the wires 14 and parts of second substrates 13. The second bonding pads 134 on the first surface 131 of the second substrate 13 are exposed by the molding compound 15 to form a mold area opening 17. Usually, the prior art stackable semiconductor package 1 can further stack another package 18 or other components in the mold area opening 17, where the bumps 181 of the package 18 electrically connect the second bonding pads 134 of the second substrate 13.

The disadvantages of the prior art stackable semiconductor package 1 are described as follows. First, parts of the second substrate 13 are hung. The first bonding pads 133 are located on a region (that is the overhang portion), which is relatively outside the chip 12, and the horizontal distance between the first bonding pads 133 and the edge of the chip 12 is defined as a overhanging length L1. Shown by experimental data, once the overhanging length L1 is three times longer than the thickness T1 of the second substrate 13, the overhang portion shakes or sways during the wire bonding process, and it therefore causes difficulties in wire bonding. Moreover, if the second substrate 13 suffers a huge stress during the wire bonding process, the second substrate 13 might even crack. Secondly, due to the above-mentioned shake, sway or crack, the overhang portion can not extend too far from the edge of the chip 12, and the area of the second surface 132 is therefore restricted. As a result, the layout space of the second bonding pads 134, which is exposed by the mold area opening 17 on the first surface 131 of the second substrate 13, is limited. Finally, in order to reduce the occurring of the above-mentioned shake, sway or crack, the second substrate 13 cannot be too thin. Thus, the whole thickness of the prior art stackable semiconductor package 1 cannot be reduced effectively.

Accordingly, a stackable semiconductor package having originality and advancement is needed to solve the above-mentioned problem.

SUMMARY OF THE INVENTION

It is therefore a primary object of the claimed invention to provide a stackable semiconductor package, comprising a first substrate, a chip, a second substrate, a plurality of second wires, at least one supporting element and a molding compound. The first substrate has a first surface and a second surface. The chip is disposed on and electrically connected to the first surface of the first substrate. The second substrate is disposed above the chip, and has a first surface and a second surface. The first surface of the second substrate comprises a plurality of first bonding pads and a plurality of second bonding pads. An area of the second surface is larger than an area of a surface of the chip. The second wires electrically connect the first bonding pads of the second substrate to the first surface of the first substrate. The supporting element is disposed between the first surface of the first substrate and the second surface of the second substrate for supporting the second substrate. The molding compound, encapsulates the first surface of the first substrate, the chip, the supporting element, the second wires and the first bonding pads, and exposes the second bonding pads. Accordingly, the overhang portion of the second substrate will not shake, sway or crack during the wire bonding process. Furthermore, the area of the second surface can be enlarged to place more components. In addition, the thickness of the second substrate can be reduced so to reduce the whole thickness of the stackable semiconductor package.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
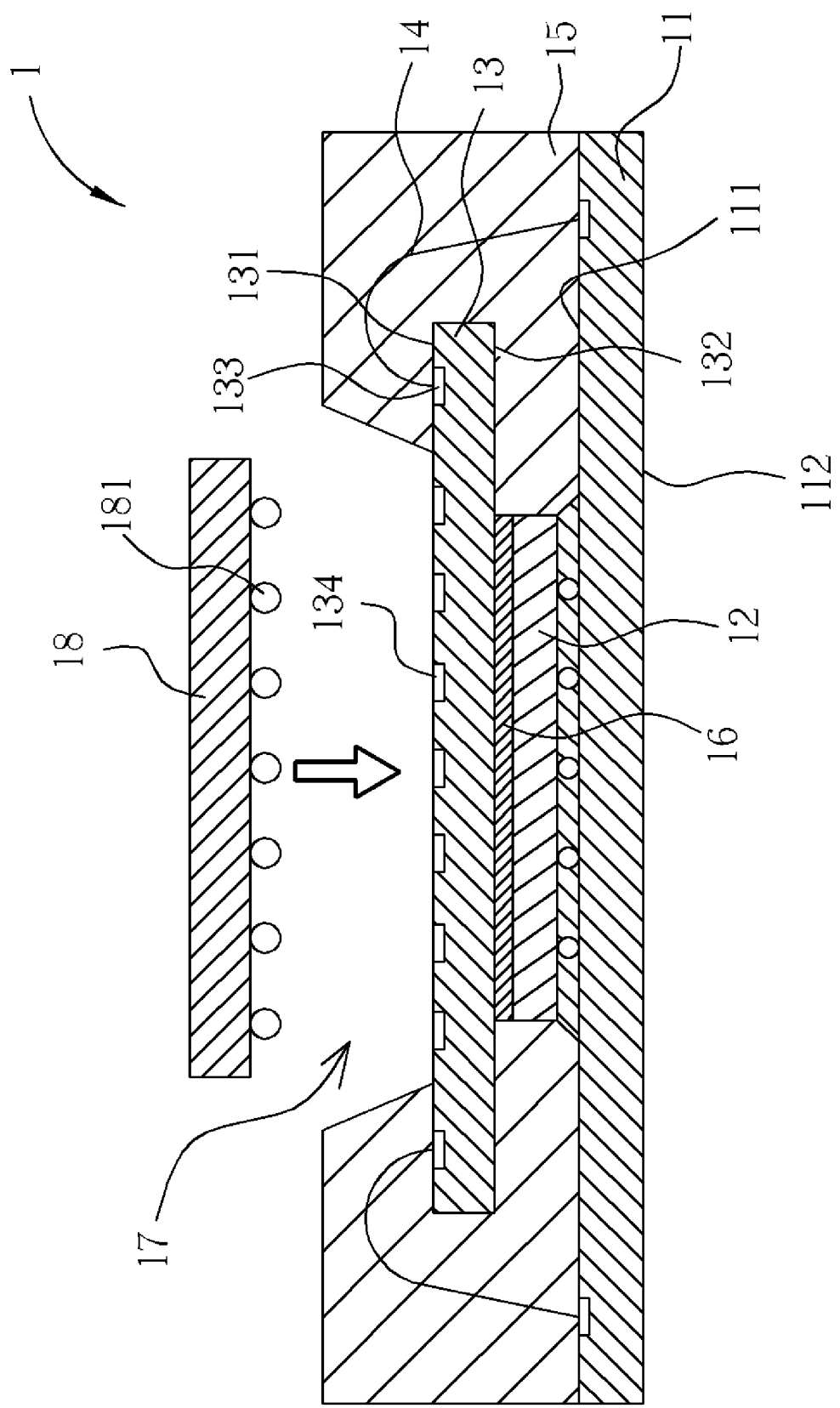
FIG. 1 is a cross-sectional schematic diagram showing the prior art stackable semiconductor package.
Figure 2:
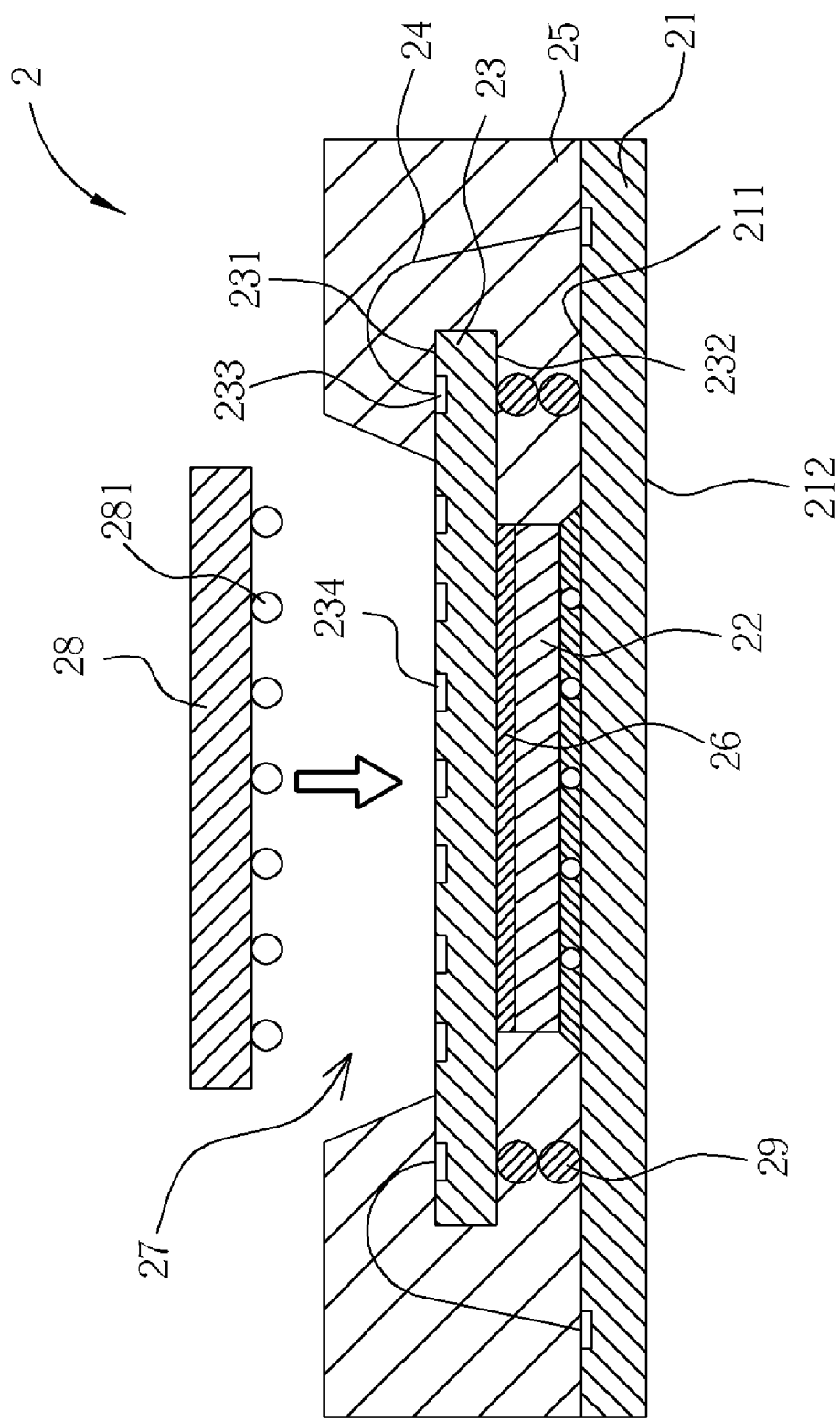
FIG. 2 is a cross-sectional diagram showing a stackable semiconductor package according to the first preferred embodiment of the present invention.

Please refer to FIG. 2. FIG. 2 is a cross-sectional diagram showing a stackable semiconductor package according to the first preferred embodiment of the present invention. The stackable semiconductor package 2 includes a first substrate 21, a chip 22, a second substrate 23, at least one supporting element (such as at least one dummy bump 29, where the dummy bump 29 does not have the function of electrically connecting) and a molding compound 25. The first substrate 21 has a first surface 211 and a second surface 212. The chip 22 is disposed on the first surface 211 of the first substrate 21, and is electrically connected to the first surface 211 of the first substrate 21. In this embodiment, the chip 22 connects to the first surface 211 of the first substrate 21 by means of flip chip technology.

The second substrate 23 is adhered onto the chip 22 by an adhesive layer 26. The second substrate 23 has a first surface 231 and a second surface 232, where the first surface 231 includes a plurality of first bonding pads 233 and a plurality of second bonding pads 234. In top view, the area of the second surface 232 is larger than the area of a surface of the chip 22. This makes some portions of the second substrate 23 extend beyond the chip 22, and become an overhang portion. The first bonding pads 233 are positioned on a region (that is the overhang portion), which is relatively outside the chip 22, and the horizontal distance between the first bonding pads 233 and the edge of the chip 22 is defined as a overhanging length L2. The second substrate 23 is electrically connected to the first substrate 21. In this embodiment, the first bonding pads 233 of the second substrate 23 are electrically connected to the first surface 211 of the first substrate 21 through a plurality of second wires 24.

The dummy bump 29 is deposited between the first surface 211 of the first substrate 21 and the second surface 232 of the second substrate 23 in order to support the second substrate 23. In this embodiment, due to the support of the dummy bump 29, even though the overhanging length L2 is three times longer than the thickness T2 of the second substrate 23, the overhang portion of the second substrate 23 will not shake or sway during the wire bonding process. Furthermore, the area of the second surface 232 can be enlarged to place more components therein. In addition, the thickness of the second substrate 23 can be reduced so to reduce the whole thickness of the stackable semiconductor package 2.

The molding compound 25 encapsulates the first surface 211 of the first substrate 21, the chip 22, the second wires 24, the dummy bump 29, the first bonding pads 233, and parts of the second substrate 23. In the meanwhile, the molding compound 25 exposes the second bonding pads 234 on the first surface 231 of the second substrate 23 to form a mold area opening 27. Usually, another package 28 or other components can be further stacked in the mold area opening 27 of the stackable semiconductor package 2, where the bumps 281 of the package 28 can electrically connect to the second bonding pads 234 of the second substrate 23.

Figure 3:
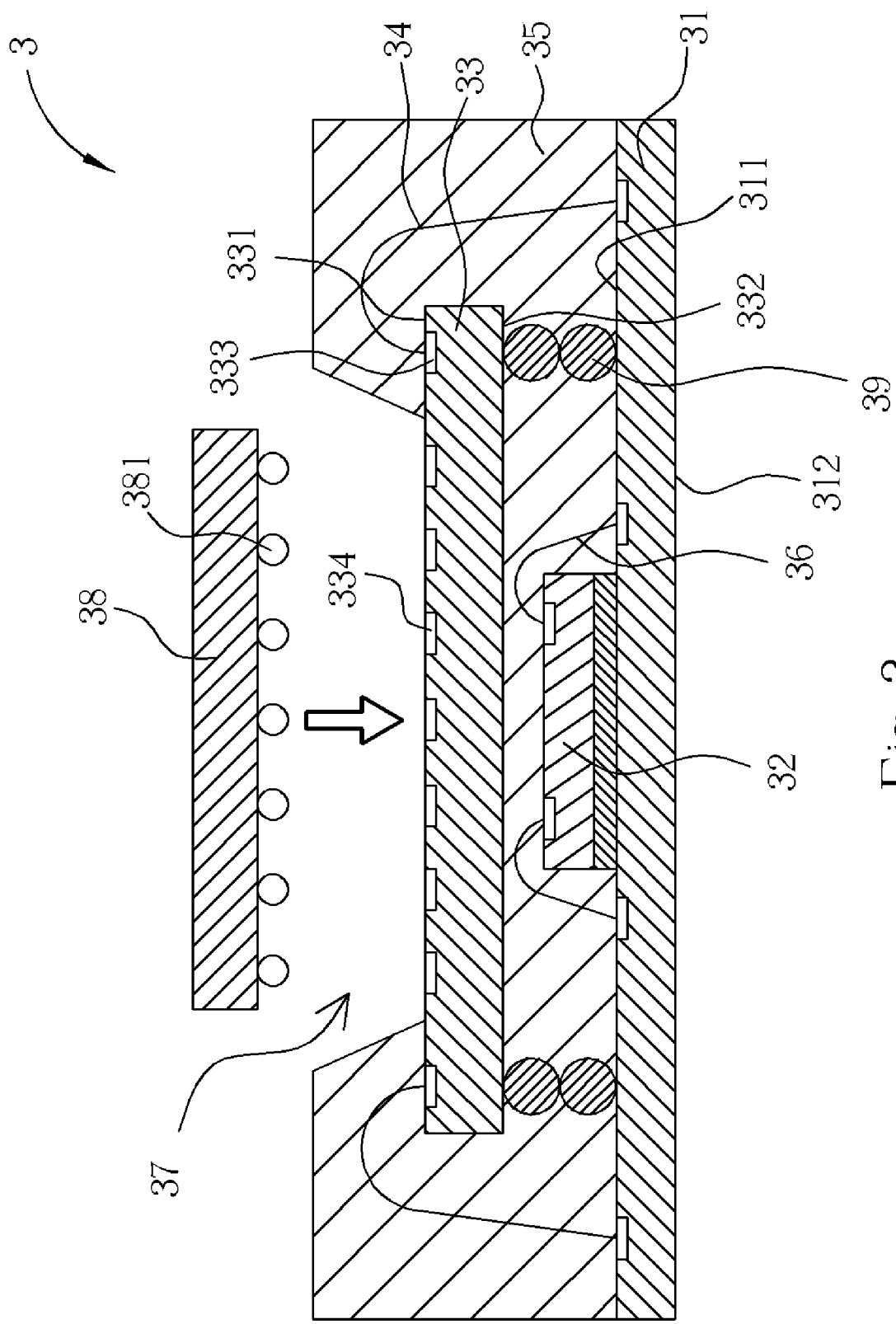
FIG. 3 is a cross-sectional diagram illustrating a stackable semiconductor package according to the second preferred embodiment of the present invention.

Please refer to FIG. 3. FIG. 3 is a cross-sectional diagram illustrating a stackable semiconductor package according to the second preferred embodiment of the present invention. The stackable semiconductor package 3 includes a first substrate 31, a chip 32, a second substrate 33, a plurality of first wires 36, at least one supporting element (such as at least one dummy bump 39), and a molding compound 35. The first substrate 31 has a first surface 311 and a second surface 312. The chip 32 is adhered to and is electrically connected to the first surface 311 of the first substrate 3.

The second substrate 33 is located above the chip 32. The second substrate 33 has a first surface 331 and a second surface 332, and the first surface 331 includes a plurality of first bonding pads 333 and a plurality of second bonding pads 334. In top view, the area of the second surface 332 is larger than the area of a surface of the chip 32. The first bonding pads 333 of the second substrate 33 are electrically connected to the first surface 311 of the first substrate 31 through a plurality of second wires 34.

The dummy bump 39 is deposited between the first surface 311 of the first substrate 31 and the second surface 332 of the second substrate 33 in order to support the second substrate 33. The molding compound 35 encapsulates the first surface 311 of the first substrate 31, the chip 32, the first wires 36, the second wires 34, the dummy bump 39, the first bonding pads 333, and parts of the second substrate 33. In the meanwhile, the molding compound 35 exposes the second bonding pads 334 on the first surface 331 of the second substrate 33 to form a mold area opening 37. Usually, another package 38 or other components can be further stacked in the mold area opening 37 of the stackable semiconductor package 3, where the bumps 381 of the package 38 can electrically connect to the second bonding pads 334 of the second substrate 33.

Figure 4:
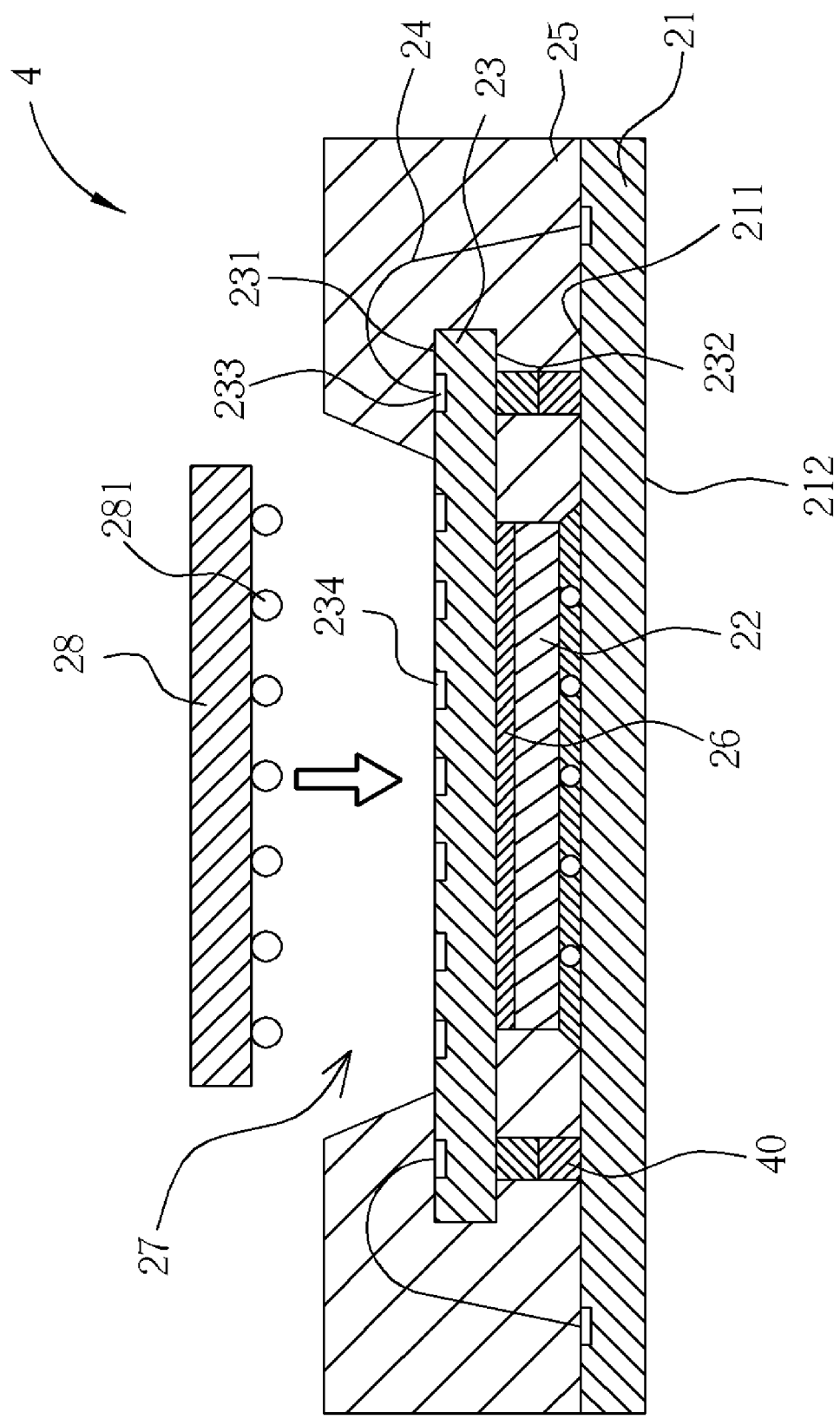
FIG. 4 is a cross-sectional diagram illustrating a stackable semiconductor package according to the third preferred embodiment of the present invention.

Please refer to FIG. 4. FIG. 4 is a cross-sectional diagram illustrating a stackable semiconductor package according to the third preferred embodiment of the present invention. The stackable semiconductor package 4 in this embodiment is similar to the stackable semiconductor package 2 in the first embodiment (shown in FIG. 2), wherein the same labels will be carried to designate the same elements. The difference between the stackable semiconductor package 4 of this embodiment and the stackable semiconductor package 2 of the first embodiment is that the supporting element is at least one passive component 40.

Figure 5:
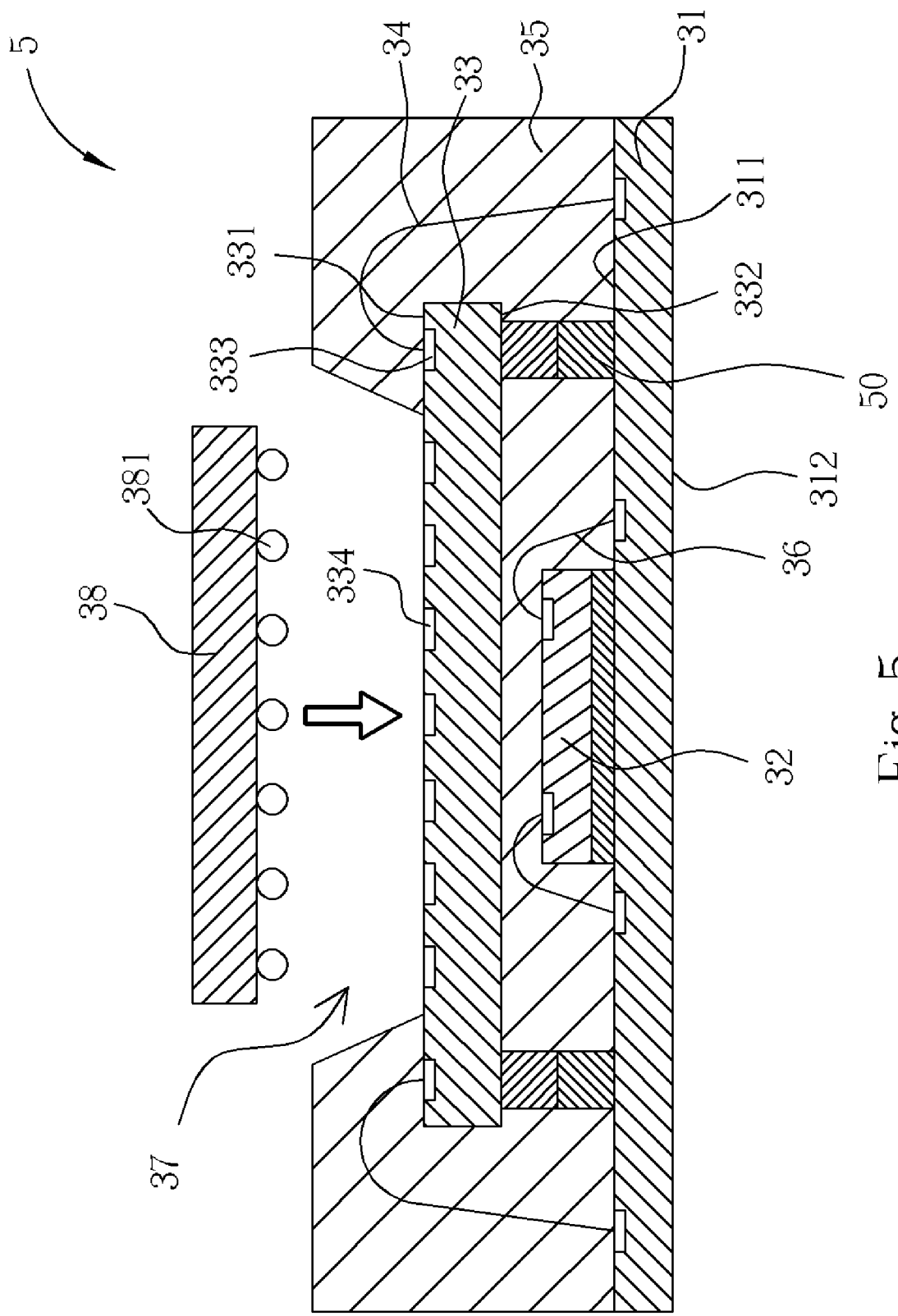
FIG. 5 is a cross-sectional diagram illustrating a stackable semiconductor package according to the fourth preferred embodiment of the present invention.

Please refer to FIG. 5. FIG. 5 is a cross-sectional diagram illustrating a stackable semiconductor package according to the fourth preferred embodiment of the present invention. The stackable semiconductor package 5 in this embodiment is similar to the stackable semiconductor package 3 in the second embodiment (shown in FIG. 3), wherein the same labels will be carried to designate the same elements. The difference between the stackable semiconductor package 5 of this embodiment and the stackable semiconductor package 3 of the second embodiment is that the supporting element is at least one passive component 50.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A stackable semiconductor package comprising:
   a first substrate having a first surface and a second surface;
   a chip disposed on and electrically connected to the first surface of the first substrate;
   a second substrate disposed above the chip, having a first surface and a second surface, the first surface of the second substrate comprising a plurality of first bonding pads and a plurality of second bonding pads, an area of the second surface being larger than an area of a surface of the chip;
   a plurality of second wires, electrically connecting the first bonding pads of the second substrate to the first surface of the first substrate;
   at least one supporting element disposed between the first surface of the first substrate and the second surface of the second substrate for supporting the second substrate; and
   a molding compound, encapsulating the first surface of the first substrate, the chip, the supporting element, the second wires and the first bonding pads, and exposing the second bonding pads.

2. The stackable semiconductor package of claim 1, wherein the chip connecting to the first surface of the first substrate by means of flip chip technology.

3. The stackable semiconductor package of claim 1, wherein the chip connecting to the first surface of the first substrate by a plurality of first wires.

4. The stackable semiconductor package of claim 1, wherein the second substrate is adhered onto the chip by an adhesive layer.

5. The stackable semiconductor package of claim 1, wherein the supporting element is at least one dummy bump.

6. The stackable semiconductor package of claim 1, wherein the supporting element is at least one passive component.

7. The stackable semiconductor package of claim 1, wherein the first bonding pads are located on a region that is relatively outside the chip.

8. The stackable semiconductor package of claim 1, wherein a horizontal distance between the first bonding pads and an edge of the chip is defined as a overhanging length, wherein the overhanging length is three times longer than the thickness of the second substrate.

* * * * *